United States Patent [19]

Hornung et al.

[11] 4,395,681
[45] Jul. 26, 1983

[54] SYSTEM FOR COMPENSATING THE OFFSET VOLTAGE OF A DIFFERENTIAL AMPLIFIER

[75] Inventors: Robert Hornung, Mennecy; Gerard Lebesnerais, Perthes En Gatinis, both of France

[73] Assignee: International Business Machines Corp., Armonk, N.Y.

[21] Appl. No.: 219,543

[22] Filed: Dec. 23, 1980

[30] Foreign Application Priority Data

Jan. 9, 1980 [FR] France .................................. 80 00750

[51] Int. Cl.³ .............................................. H03F 3/45
[52] U.S. Cl. ...................................... 330/259; 330/261
[58] Field of Search .................... 330/9, 69, 127, 129, 330/252, 259, 261; 328/162, 165

[56] References Cited

U.S. PATENT DOCUMENTS 4,229,703 10/1980 Bustin .................................. 330/9 X Primary Examiner—James B. Mullins
Attorney, Agent, or Firm—Robert J. Haase; John F. Ohlandt

[57] ABSTRACT

A system is disclosed for compensating for the offset voltage problem which occurs in certain types of differential amplifiers; a differential amplifier, in the form of an operational amplifier, is provided with two generators of input signals whose difference is to be amplified; further included is an offset voltage compensation loop comprising a comparator, an n-bit up/down counter and a digital analog converter means; the output of said means being connected to said generators of input signals so as to modulate the input signals; and said digital analog converter means including first and second n-1 bit digital analog converters.

6 Claims, 8 Drawing Figures

SYSTEM FOR COMPENSATING THE OFFSET VOLTAGE OF A DIFFERENTIAL AMPLIFIER

BACKGROUND OF THE INVENTION

1. Field of the Invention

This invention relates to the field of differential amplifiers, especially operational amplifiers, and more particularly, to the correction of the offset voltage of these amplifiers. It also relates to a macro-functional circuit which operates as a digital analog converter.

In certain cases the information or input data of a circuit is given by the resistor value. This applies especially to the read circuits of magnetic bubble memories. The presence or absence of a bubble at a given point is indicated by a change in the value of the two resistors R1 and R2. If a bubble is present, the resistor pair (R1, R2) is given a first value (R1S, R2S); if no bubble is present, the pair is given a second value. The detection of the bubble presence or absence status is performed simply by causing a current to flow through each of the resistors R1 and R2 and by measuring the difference of the voltage drop $V_E = R1S.I1 - R2S.I2$ in a differential amplifier (see FIG. 1). However, in order to reduce static and dynamic errors due to the asymmetry of the elements of the input circuit (i.e. R1, R2 and I1, I2), the latter must be such that the two inputs of the differential amplifier have the same impedance; this means that $R1 = R2 = R$ and $I1 = I2 = I$.

If the input signal $V_E$ is absent, the offset voltage at input $\Delta V_O$ (which will be explained later) is such that $\Delta V_O = R10I1 - R20I2$, R10 and R20 being the values of the resistors R1 and R2 and when no signal is present.

The advantage of this circuit is that it is now completely symmetrical, which allows for compensation of the influence of the input current and the resistor temperature drifts. It also allows for compensation of the noise effects generated by the rapid voltage variations and the parasitic capacities ($V_{NOISE} = RC \, dV/dt$).

The major problem related to this type of circuit lies in the significant offset voltage which appears between the two amplifier inputs. This voltage is produced by the static difference between the R1 and R2 values on the one hand, and the I1 and I2 values on the other hand, whereas it is desirable that these values be equal. For certain approximations, the relations $R1 = R2 = R$ and $I1 = I2 = I$ are acceptable. This offset voltage is important enough to justify compensation.

2. Background Art

It will be understood that a number of solutions have been attempted in the art for the problem described above. For example, correction by means of a potentiometer is possible under certain circumstances, but this is a costly and rather unreliable solution.

Correction by the so-called active trimming technique is not possible in cases where R1 and R2 are outside the circuits. A dynamic compensation method is therefore required for this offset voltage. The compensation method known as chopper stabilization allows for offset compensation. For example, reference could be made to the standard manual Operational Amplifier Design and Applications, by Burr-Brown, McGraw-Hill, pages 150 to 164. The principle of this technique is to separate the DC component by means of an LF amplifier. An equivalent representation for a differential amplifier is illustrated in FIG. 2. The LF amplifier must have a cutoff frequency of the order of several KHz, which requires the use of relatively high capacitances (30 to 50 picofarads). However, the values of the capacitors which can be implemented in monolithic circuits are rather limited because they need too much of the surface and also considerably reduce the production capacity. Another disadvantage is the increase in the number of capacitors for each amplifier input and the nonsymmetry of these inputs.

FIG. 3 illustrates a further possible compensation method. The gain of the input amplifier is low enough to allow it to operate in the linear region regardless of the offset voltage at the input; that is, the product of the gain multiplied by the offset voltage is lower than the maximum voltage admissible at the output of this amplifier. The DC component is then suppressed by capacitor C and the AC component is amplified by the second amplifier. The disadvantage of this approach is the low input stage gain, in addition to the capacitor problem already mentioned. In effect, the rejection rate in common mode is proportional to the amplifier gain, and when the input offset voltage is high, the gain must be low (2 to 5).

SUMMARY OF THE INVENTION

This invention relates to a method to correct the offset voltage of a differential amplifier whose plus and minus inputs are connected to two resistors R1 and R2 and two current sources I1 and I2 respectively, the amplifier being provided with a feedback loop, comprising a comparator having one input connected to the reference voltage $V_{REF}$ and whose output drives a clock synchronized up/down counter. The latter drives a digital analog converter (n bits) provided with two complementary outputs supplying control currents i1 and i2 so that $i1 + i2 = $ constant, currents i1 and i2 controlling these current sources. This method is characterized in that the n-bit digital analog converter is replaced by two n-1 bit digital analog converters associated with complementary control elements. This invention also relates to the macro-functional circuit consisting of these two n-1 bit digital analog converters driven by the n-bit up/down counter by means of said control elements.

The advantages are related to the feasibility of such a macro-functional circuit; that is, it may be impossible or very difficult to design an n-bit digital analog converter implemented in MTL technology. (At present n = 5 can be assumed), whereas two n-1 digital analog converters can be implemented easily (this is the case for n = 4).

Another advantage is the considerable space saving resulting from this modification (a factor of about 3).

Further objectives, characteristics and advantages of this invention are given in the following description, with reference to the attached figures which illustrate the preferred embodiment of this invention.

DESCRIPTION OF PREFERRED EMBODIMENT

Figure 1:
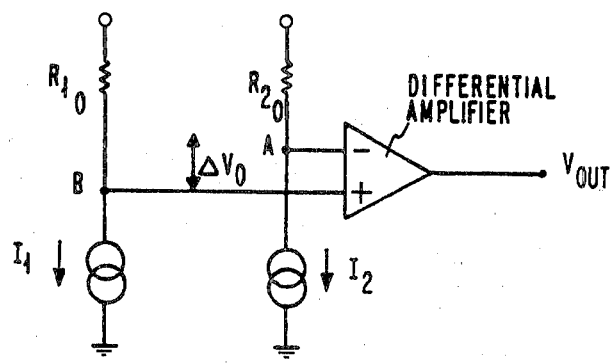
FIG. 1 is a diagram of the simplified electrical circuit of an operational magnetic bubble read amplifier based on a differential amplifier.
Figure 2:
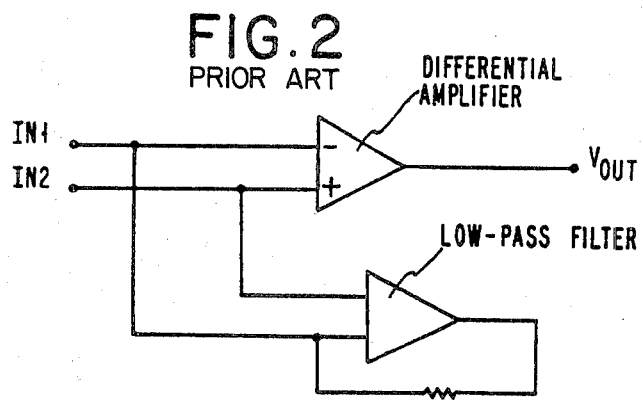
FIG. 2 is a diagram illustrating a solution given by the former state of the art to correct the offset voltage of the differential amplifier.
Figure 3:
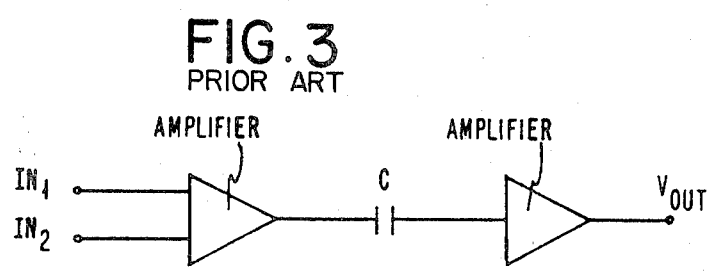
FIG. 3 illustrates another solution given by the former state of the art to correct the offset voltage of the differential amplifier.
Figure 4:
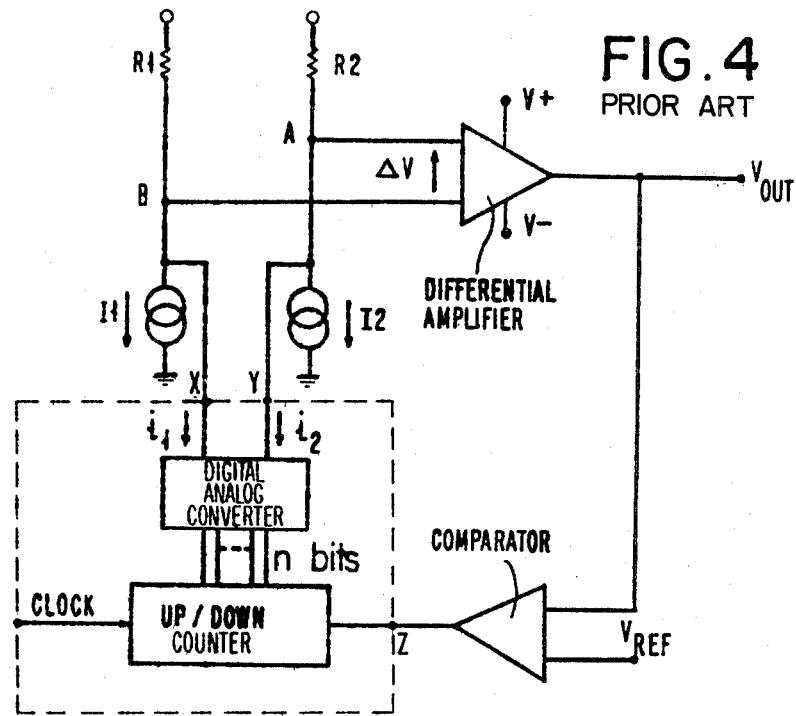
FIG. 4 illustrates a further solution given by the former state of the art to correct the offset voltage of the differential amplifier, using more particularly an n-bit digital analog converter.

A well-known offset voltage compensation circuit is shown in FIG. 4. When no signal is applied to the differential amplifier inputs, the input stage of this circuit, composed of resistors R1 and R2, and current sources I1 and I2, yields a voltage referred to as offset voltage $\Delta V_O$ between gates A and B ($\Delta V_O = V_A - V_B$). It should be noted that the presence of such a voltage $\Delta V_O$ is mostly due to the following factors: imperfect matching between the resistors R1 and R2 and the current sources I1 and I2, that is, it is impossible to obtain I1 = I2 = I and R1 = R2 = R; the heat drift of the components; the offset voltage of the amplifier; and the drifts due to aging.

Compensation is based on the principle of reducing voltage $\Delta V_O$ present when the circuit is switched on, to a value such that the output voltage $V_{out}$ of the differential amplifier remains within the voltage range of a medium value of $V_{REF}$, limited by the two extremes of input voltage, $V_{Smin}$ and $V_{Smax}$. If no input signal is present, the offset voltage $\Delta V_O$ at the input of the differential amplifier produces $V_{out} = G\Delta V_O$ (G being the amplifier gain fed between V+ and V-). In order to avoid saturation of the amplifier and to ensure a certain contingency, the output signal must be $V_{out} = G\Delta V_O$ so that $V- < G\Delta V_O < V+$. If an input signal $V_E$ is applied, the relation must for the same reason be: $V- < G(\Delta V_O + V_E) < V+$ i.e. $V_{Smin} < |G\Delta V_O| < V_{Smax}$, if $V_{Smax} = V+ - GV_E$ and $V_{Smin} = V- + GV_E$. This condition on $V_{out}$ implies that after correction:

$$V_{Smin} < V_{out} < V_{Smax}$$

results in $$|\Delta V| \leq \frac{V_{Smax} - V_{Smin}}{2G}$$

where G is the gain of the differential amplifier.

In practice, offset voltage compensation is performed during an iteration cycle by means of the feedback loop: comparator plus up/down counter plus digital analog converter (DAC). Each up/down counter output is connected to a DAC input. During iteration, the output voltage $V_{out}$ is continuously compared with the reference voltage $V_{REF}$ which is, in fact, the mid-amplitude linear output voltage. The comparator response determines the operational mode of the counter, that is, up or down counting. In this operational mode, the variations of the counter contents are converted by the digital analog converter, in analog form, into two complementary currents i1 and i2 (so that i1 + i2 = 1) which modulates current sources I1 and I2.

Finally, these modulating or control currents cause the potentials of A and B to converge towards each other until $\Delta V = V_A - V_B$ and $V_{out}$ reach the above specified limits, that is:

$$|\Delta V| \leq \frac{V_{Smax} - V_{Smin}}{2G}$$

Figure 5:
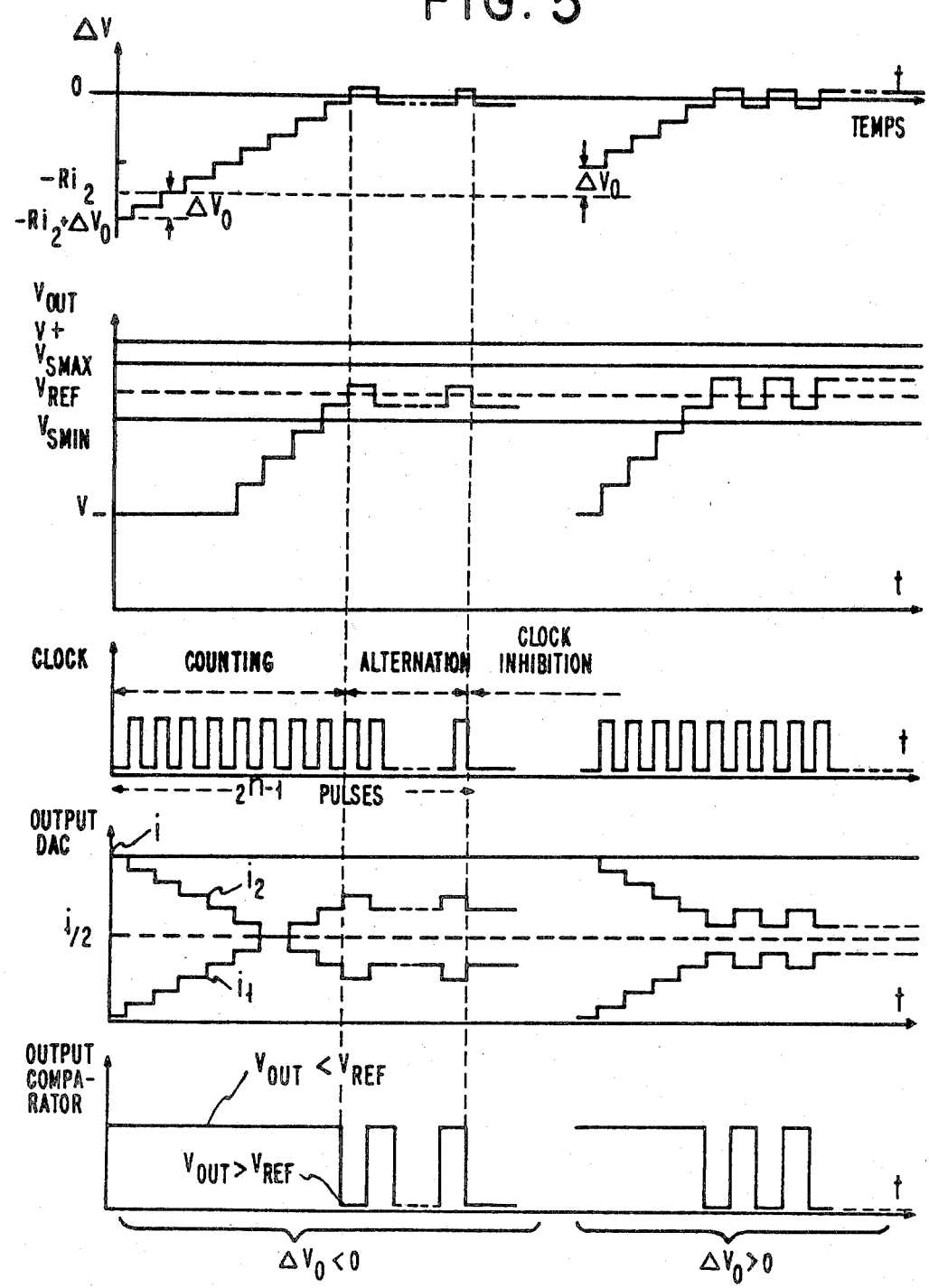
FIG. 5 is a diagram of pulse waveforms for the voltage and current at different points of the circuit illustrated in FIG. 4 and for two different operational modes corresponding to $\Delta V_O > 0$ and $\Delta V_O < 0$.

The diagram of FIG. 5 illustrates the variations of the main electrical signals of the circuit during the correction cycle of the offset voltage. The two cases considered correspond to two offset voltages of inverse polarity ($\Delta V_O < 0$ and $\Delta V_O > 0$) (seen to the left and right of center respectively) which would be present between A and B if the correction device were not used and if no signal $V_E$ were applied between these points. The inclusion of a compensation loop in the circuit and the assumption that the counter content is zero at cycle start implies in both cases that: (1) value $\Delta V$ shown in the diagram must be negative at cycle start because $\Delta V = \Delta V_O - R2 \, i2$, i2 being chosen in such a way that $i2 > \Delta V_{Omax}/R2$ (2) only the count mode is used until $V_{out}$ becomes greater than $V_{REF}$. At this point, the comparator is placed in the down status and the counter in down count mode so that balancing is achieved. The balancing condition in this diagram is represented by an oscillation of voltage $V_{out}$ around $V_{REF}$ with an amplitude of $G \times R \times I_{LSB}$ ($I_{LSB}$ being the DAC current of the least significant bit).

Owing to the fact that the counter content is zero, we have $i1 = 0$ and $i2 = $ maximum current, that is, node A is at the lowest potential and the output voltage $V_{out}$ is saturated at a negative value around V–. During the count, current i1 increases while current i2 decreases (however, $\Delta V$ is always negative). When $V_{out} > V_{REF}$ the comparator status changes, the counter counts down until a status identical with the preceding one is reached where $V_{out} < V_{REF}$ thus oscillating around this balancing position.

Knowing that the zero (or one) setting of the counter is not mandatory in this type of circuit, it can be seen that the operational mode of the counter depends on: the initial status of the counter contents at switch-on time, and the value of the offset voltage if no compensation circuit ($\Delta V_O$) had been used. However, in all cases this mode will not change until the balancing voltage has been reached.

The LSB value of DAC, $I_{LSB}$ as well as the converter resolution (that is, the number of bits) can be determined by simply using the G values $V_{Smin}$, $V_{Smax}$ and the maximum value $\pm \Delta V_{Omax}$ of the offset voltage if no signal is applied to the input. Thus, the LSB value is such that $$R.I_{LSB} \leq \frac{V_{Smax} - V_{Smin}}{2G}$$

the resolution n of DAC (number of bits) gives a first value n such that $2^n > k + 1$.

$$\text{with } k = \frac{\Delta V_{Omax}}{R.I_{LSB}}$$

(k being rounded up to the first integer).

The duration of the compensation cycle corresponds to the number of clock pulses required to ensure compensation of the maximum offset voltage $\Delta V_{Omax}$, that is, 2−n1 pulses; n being the number of bits of the counter (and consequently of DAC). When the cycle is terminated, the clock is inhibited and the input signal can now be amplified by the differential amplifier. This input signal VE should be such that the output voltage $V_{out}$ remains within the allowed limits $V_{Smin}$ and $V_{Smax}$.

The circuit integration is limited by the complexity of the counter and DAC as compared with that of the differential amplifier. This explains why this type of compensation is very rare: it is only used when all other compensation techniques have failed. This is the case for the present technique when used for magnetic bubble read amplifiers where compensation must be obtained in the presence of a magnetic field.

Figure 6:
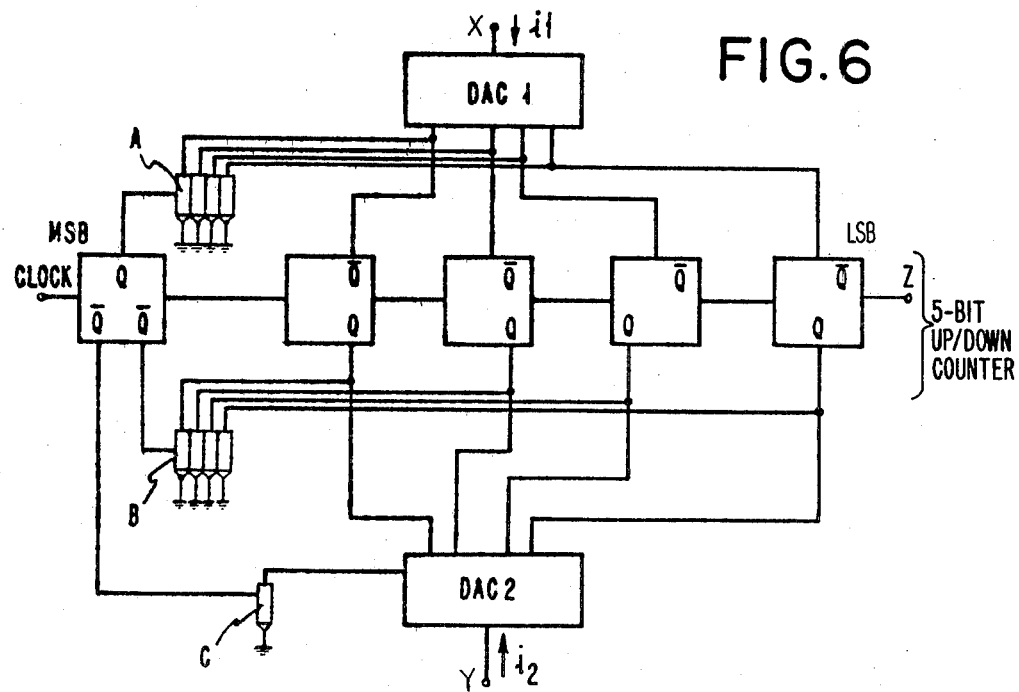
FIG. 6 gives the solution of the present invention, where the n-bit digital analog converter, as seen in FIG. 4, is replaced by two n-1 bit analog converters.

The solution proposed to improve this circuit of FIG. 4 is shown in FIG. 6. It replaces the n-bit DAC described above by a double (n-1) bits converter using the Merged Transistor Logic (MTL) technology. This solution has the advantage of dividing by 3 the space needed by the digital analog converter on the silicon wafer. The principle of operation is as follows.

One of the converters is designed to transcribe the half-full lower counter scale (that is, from 0 . . . 0 to 0.1 . . . 1), the other one transcribing the half-full upper counter scale (that is, 10 . . . 0 to 1 . . . 1). FIG. 6 shows the diagram of the converter plus up/down counter arrangement for a 5-bit counter.

The output current of converter 1 (DAC 1) corresponds to current i1, that of converter 2 (DAC 2) corresponds to current i2 of the first circuit. It can be seen that one of the two converters can be inhibited simply by using the two MTL gates A and B whose inputs are respectively the most significant bit (MSB) of the counter and its complement, and whose AND-dotted outputs are respectively connected to the complementary counter outputs, (that is, also the converter 1 inputs) and to the real counter outputs (that is, also the converter 2 inputs). When the counter outputs are set to 00000, DAC1 is in full scale whereas DAC2 is inhibited. When the counter reaches 01111 (half-full scale), the DAC1 output current 1 decreases, and DAC2 remains inhibited because gate B is activated. Gate B remains activated until the MSB reaches a value=1; DAC1 is then also inhibited because gate A is activated.

It must be noted that in the latter case if the full-scale DAC1 and DAC2 currents are equal to those of FIG. 4, the current $I_{LSB}$ of these two converters is doubled because each converter is now only used at a half-full scale of the counter.

The following corroboration table indicates the status of digital analog converter inputs and outputs for the counter statuses.

TABLE I

| Up/down Counter | MSB | Converter 1 | Converter 2 | Currents i₁ | i₂ | MTL Gate C |
|---|---|---|---|---|---|---|
| ← ½ full lower scale → | | | | | | |
| 0 0 0 0 0 | 0 | 1 1 1 1 | 0 0 0 0 | 15 | 0 | 0 |
| 0 0 0 0 1 | 0 | 1 1 1 0 | 0 0 0 0 | 14 | 0 | 0 |
| 0 0 0 1 0 | 0 | 1 1 0 1 | 0 0 0 0 | 13 | 0 | 0 |
| . | . | . | . | . | . | . |
| 0 1 1 0 1 | 0 | 0 0 1 0 | 0 0 0 0 | 2 | 0 | 0 |
| 0 1 1 1 0 | 0 | 0 0 0 1 | 0 0 0 0 | 1 | 0 | 0 |
| 0 1 1 1 1 | 0 | 0 0 0 0 | 0 0 0 0 | 0 | 0 | 0 |
| ← ½ full upper scale → | | | | | | |
| 1 0 0 0 0 | 1 | 0 0 0 0 | 0 0 0 0 | 0 | 1 | 1 |
| 1 0 0 0 1 | . | 0 0 0 0 | 0 0 0 1 | 0 | 2 | 1 |

TABLE I-continued

| Up/down Counter | MSB | Converter 1 | Converter 2 | Currents i₁ | i₂ | MTL Gate C |
|---|---|---|---|---|---|---|
| 1 0 0 1 0 | . | 0 0 0 0 | 0 0 1 0 | 0 | 3 | 1 |
| . | . | . | . | . | . | . |
| 1 1 1 0 1 | 1 | 0 0 0 0 | 1 1 0 1 | 0 | 14 | 1 |
| 1 1 1 1 0 | 1 | 0 0 0 0 | 1 1 1 0 | 0 | 15 | 1 |
| 1 1 1 1 1 | 1 | 0 0 0 0 | 1 1 1 1 | 0 | 16 | 1 |

When consulting the first three values of the table, it appears that in counter positions 01111 and 10000 the same 00000 input is associated with converters 1 and 2. This results in a missing position in converter outputs if scanning the whole counter scale. This lack is easily made up by adding continuously one current unit $I_{LSB}$ to the DAC2 in operation. In other words DAC2 is provided with two LSB devices, one being always operational when DAC2 is active (that is, when the MSB is present). The MTL gate C, seen in the lower part of FIG. 6, executes this function.

Figure 7:
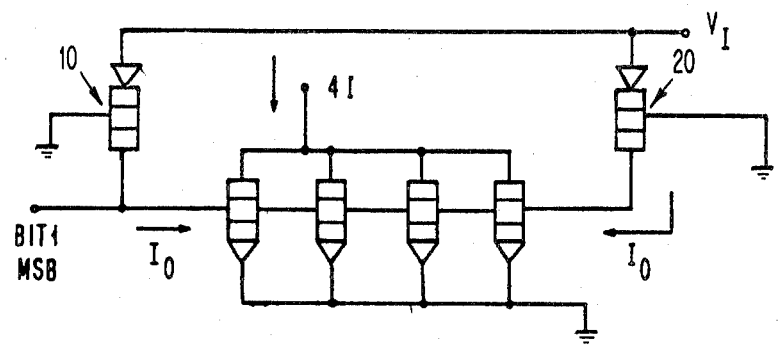
FIG. 7 shows the simplified operation of an MTL 4-bit digital analog converter.
Figure 7:
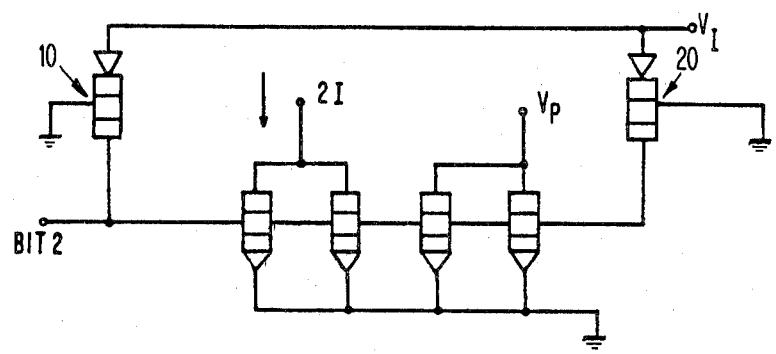
Figure 7:
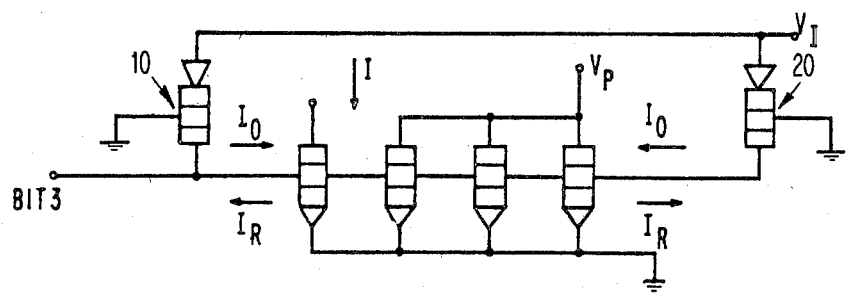
Figure 7:
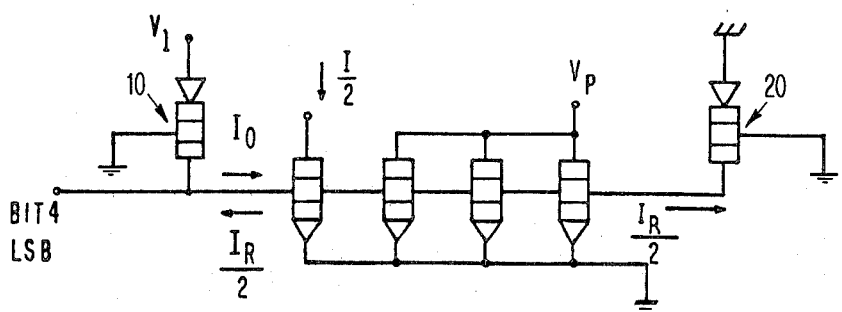

FIG. 7 gives details on DAC1 and DAC2. Each 4-bit DAC consists of four MTL 4-collector cells. Each MTL cell includes two injectors (the PNP transistors 10 and 20 connected to voltage $V_I$). This permits injection from each base end which causes the difference between the current of the four collectors to decrease. For the MSB (bit 1), the four collectors are connected to the output. For the second bit (bit 2), two collectors are connected to the output, the two others being connected to any positive voltage Vp, so that this cell has exactly the same condition as the preceding one. For the third bit, one collector is connected to the output, the three others being connected to voltage Vp. The fourth bit is the same cell as the preceding one except that only one of its injectors is connected to $V_I$, the other one being connected to ground for symmetry reasons (to take into account current $I_R$ reinjected into the NPN base in the injector). DAC2 is equipped with a fifth cell (not shown) identical with cell 4 (LSB). This fifth cell is always active when DAC2 is active, as explained above.

This type of circuit is advantageous when MTL type circuitry is available on a wafer for two major reasons: (1) the implementation of a conventional 5-bit DAC by means of two MTL 4-bit converters permits, as already explained, the converter surface to be divided by three; (2) the implementation of an up/down counter by means of MTL type gates ensures direct compatibility between this counter and the converters (that is, no need to use an interface circuit).

Figure 8:
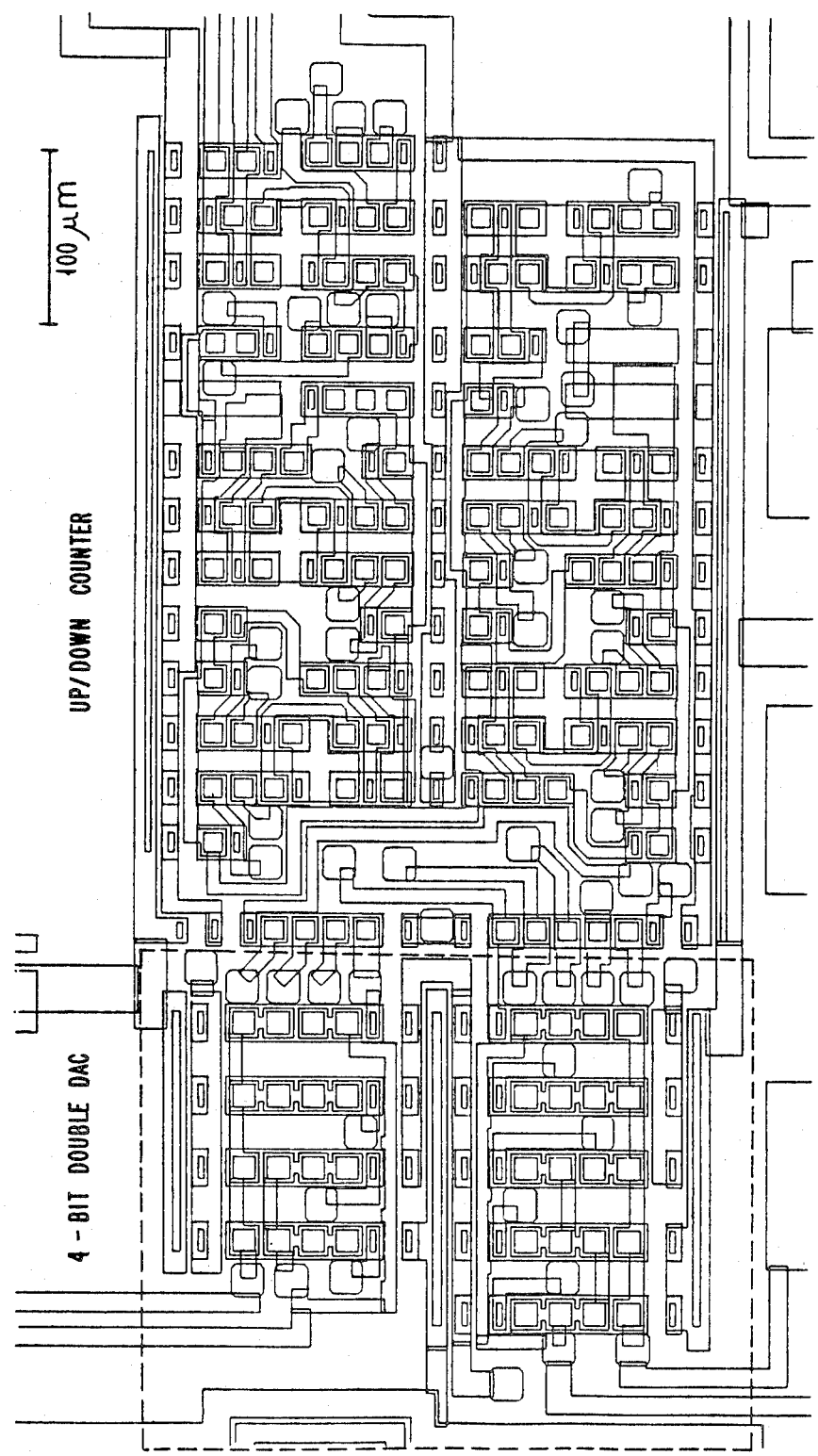
FIG. 8 shows the topology of the circuit consisting of two 4-bit digital analog converters.

FIG. 8, which shows the circuit topology, gives an idea about the integration density of the up/down counter and converter arrangement (occupied surface=210,000 μm2).

The first circuit described can be further improved by positioning the up/down counter in the midst of its full scale (positions 01111 or 10000) at the start of the correction cycle. This is possible without adding new circuitry by simply changing the topology of the MTL switches used in the up/down counter. For more information, reference may be made to the French patent application No. 77 29967 filed by the applicant on Sept. 28, 1977.

This type of initialization will cause the correction cycle duration of the offset voltage to be divided by 2, since in the worst case a half-full scale will be scanned.

Another improvement, in addition to positioning at half the full scale, can be made by including in the same unit a circuit generating the number of clock pulses required to scan the half-full scale.

Thus the compensation circuit of the offset voltage is completely invisible from the outside. In effect, at switch-on time, the following sequence will be automatically available: (1) Counter setting to 10000 (half-full scale), (2) initialization of the internal clock whose pulses are transmitted to the counter clock, (3) Clock stop after the number of pulses required.

While this invention has been particularly shown and described with reference to a preferred embodiment thereof, it will be understood by those skilled in the art that numerous changes in form and detail may be made therein without departing from the spirit and scope of the invention.

We claim:

1. A system for compensating the offset voltage of a differential amplifier comprising:
   an operational amplifier provided with two generators of input signals whose difference is to be amplified;
   an offset voltage compensation loop, including a comparator, an n-bit up/down counter, and a digital-analog converter means; the output of said comparator being connected to the input of said n-bit up/down counter, and the outputs of said counter being connected to the inputs of said digital-analog converter means;
   said digital-analog converter means including first and second n-1 bit digital-analog converters, the output of each converter being connected respectively to one of said generators of input signals so as to modulate the input signals; and in which the inputs of said first converter are connected to the complementary outputs of n-1 bits of said counter, and the inputs of said second converter are connected to the real outputs of said n-1 bits of said counter.

2. A system as defined in claim 1 in which said first and second converters are connected to supply currents $i_1$ and $i_2$ respectively to said generators, said converters being arranged symmetrically with respect to the n-bit up-down counter, and means for ensuring that said converters operate in complementary mode, that is, $i_1 + i_2 = 1$, i being a predetermined constant current.

3. A system as defined in claim 1 in which n equals 5.

4. A system as defined in claim 1 further comprising means for inhibiting said first and second converters, said means including gates whose inputs are respectively the most significant bit of a counter and its complement, and whose AND-dotted outputs are respectively connected to the complementary outputs and to the real outputs of said counter.

5. A system as defined in claim 1 in which each of the first and second converters includes four cells, each cell having four collectors.

6. A system as defined in claim 5, further including a fifth cell in said second converter to provide for an additional least significant bit.

* * * * *

UNITED STATES PATENT AND TRADEMARK OFFICE
CERTIFICATE OF CORRECTION

PATENT NO. : 4,395,681
DATED : July 26, 1983
INVENTOR(S) : Robert Hornung and Gerard Lebesnerais It is certified that error appears in the above-identified patent and that said Letters Patent are hereby corrected as shown below:

Column 1, line 33, delete "and", second occurrence.

line 43, "difference" should read "differences".

Column 5, line 23, "0.1" should read --01--.

Signed and Sealed this

Twenty-seventh Day of September 1983

[SEAL]

Attest:

GERALD J. MOSSINGHOFF

*Attesting Officer*   *Commissioner of Patents and Trademarks*